United States Patent
Sanfilippo et al.

(10) Patent No.: US 8,778,721 B2
(45) Date of Patent: Jul. 15, 2014

(54) ARRAY OF MUTUALLY ISOLATED, GEIGER-MODE, AVALANCHE PHOTODIODES AND MANUFACTURING METHOD THEREOF

(75) Inventors: Delfo Nunziato Sanfilippo, Catania (IT); Piero Giorgio Fallica, Catania (IT)

(73) Assignee: STMicroelectronics S.r.l., Agrate Brianza (MB) (IT)

( * ) Notice: Subject to any disclaimer, the term of this patent is extended or adjusted under 35 U.S.C. 154(b) by 130 days.

(21) Appl. No.: 12/356,445

(22) Filed: Jan. 20, 2009

(65) Prior Publication Data

US 2009/0184384 A1    Jul. 23, 2009

(30) Foreign Application Priority Data

Jan. 18, 2008 (IT) .............. TO2008A0046

(51) Int. Cl.
    *H01L 31/0232*    (2014.01)
(52) U.S. Cl.
    USPC ............... 438/73; 438/91; 438/380; 438/684
(58) Field of Classification Search
    USPC ....... 250/214.1; 257/432, 438, 446, E31.063, 257/E27.133, E27.129, E21.536, E29.255, 257/E21.327, E29.012, E31.119, E31.002, 257/E31.116; 438/72, 73, 91, 380, 684
    See application file for complete search history.

(56) References Cited

U.S. PATENT DOCUMENTS

| | | | |
|---|---|---|---|
| 4,313,127 A | 1/1982 | Su et al. | |
| 4,972,244 A * | 11/1990 | Buffet et al. | 257/442 |
| 5,360,987 A * | 11/1994 | Shibib | 257/446 |
| 5,367,188 A | 11/1994 | Kudo | |
| 5,501,893 A | 3/1996 | Laermer et al. | |
| 5,596,186 A * | 1/1997 | Kobayashi | 250/214.1 |
| 6,307,244 B1 | 10/2001 | Shikata | |
| 6,437,415 B1 * | 8/2002 | Kuhara et al. | 257/458 |
| 6,541,836 B2 | 4/2003 | Iwanczyk et al. | |

(Continued)

FOREIGN PATENT DOCUMENTS

| | | |
|---|---|---|
| DE | 102007037020 | 8/2008 |
| EP | 1596439 | 11/2005 |

(Continued)

OTHER PUBLICATIONS

Search Report based on Italian Patent Application Serial No. TO20080945, Ministero dello Sviluppo Economico, Munich, Nov. 4, 2009, pp. 2.

(Continued)

*Primary Examiner* — Michael Shingleton
(74) *Attorney, Agent, or Firm* — Graybeal Jackson LLP

(57) ABSTRACT

An embodiment of array of Geiger-mode avalanche photodiodes, wherein each photodiode is formed by a body of semiconductor material, having a first conductivity type and housing an anode region, of a second conductivity type, facing a top surface of the body, a cathode-contact region, having the first conductivity type and a higher doping level than the body, facing a bottom surface of the body, an insulation region extending through the body and insulating an active area from the rest of the body, the active area housing the anode region and the cathode-contact region. The insulation region is formed by a first mirror region of polycrystalline silicon, a second mirror region of metal material, and a channel-stopper region of dielectric material, surrounding the first and second mirror regions.

22 Claims, 8 Drawing Sheets

(56) References Cited

U.S. PATENT DOCUMENTS

| | | | |
|---|---|---|---|
| 6,551,904 | B2 | 4/2003 | Kawahara |
| 6,693,337 | B2* | 2/2004 | Yoneda et al. ............... 257/436 |
| 6,979,874 | B2 | 12/2005 | Harada |
| 6,995,444 | B2 | 2/2006 | Cova et al. |
| 2002/0139970 | A1 | 10/2002 | Iwanczyk et al. |
| 2007/0020791 | A1* | 1/2007 | Hsu et al. .................... 438/22 |
| 2007/0045767 | A1* | 3/2007 | Zhu et al. .................... 257/505 |
| 2008/0121988 | A1* | 5/2008 | Mallikararjunaswamy et al. .................... 257/328 |
| 2008/0157150 | A1 | 7/2008 | Shim |
| 2008/0191238 | A1 | 8/2008 | Madathil et al. |
| 2008/0308738 | A1 | 12/2008 | Li et al. |
| 2008/0315248 | A1 | 12/2008 | Tokura et al. |
| 2009/0032896 | A1 | 2/2009 | Taniguchi et al. |
| 2009/0057757 | A1 | 3/2009 | Hokomoto et al. |
| 2009/0065826 | A1 | 3/2009 | Hwang |
| 2009/0184317 | A1 | 7/2009 | Sanfilippo et al. |
| 2009/0184384 | A1 | 7/2009 | Sanfilippo et al. |
| 2010/0127314 | A1* | 5/2010 | Frach .................... 257/292 |
| 2010/0148040 | A1 | 6/2010 | Sanfilippo et al. |
| 2010/0271108 | A1 | 10/2010 | Sanfilippo et al. |
| 2011/0095388 | A1 | 4/2011 | Richter et al. |

FOREIGN PATENT DOCUMENTS

| | | |
|---|---|---|
| EP | 1744366 | 1/2007 |
| EP | 1755171 | 2/2007 |
| RU | 2102821 | 1/1998 |
| WO | 2007108456 A1 | 9/2007 |
| WO | 2008129433 | 10/2008 |

OTHER PUBLICATIONS

S. Cova, M. Ghioni, A. Lacaita, C. Samori, and F. Zappa, "Avalanche photodiodes and quenching circuits for single-photon detection", Applied Optics, vol. 35, No. 12, Apr. 20, 1996, pp. 1956-1976.

B. Dolgosheina, V. Balagurab, P. Buzhana, M. Danilovb, L. Filatovd, E. Garuttic, M. Grolle, A. Ilyina, V. Kantserova, V. Kaplina, A. Karakasha, F. Kayumova, S. Klemind, V. Korbelc, H. Meyerc, R. Mizukb, V. Morgunovb, E. Novikovb, P. Pakhlovb, E. Popovaa, V. Rusinovb, F. Sefkowc, E. Tarkovskyb, I. Tikhomirovb, Calice/SiPM Collaboration, "Status report on silicon photomultiplier development and its applications", Nuclear Instruments and Methods in Physics Research A 563 (2006), pp. 368-376.

Claudio Piemonte, "A new Silicon Photomultiplier structure for blue light detection", Nuclear Instruments and Methods in Physics Research A 568 (2006), pp. 224-232.

Z. Sadygova, A. Olshevskia, I. Chirikova, I. Zheleznykhc, A. Novikov, "Three advanced designs of micro-pixel avalanche photodiodes: Their present status, maximum possibilities and limitations", Nuclear Instruments and Methods in Physics Research A 567 (2006), pp. 70-73.

W.J. Kindt, N. H. Shahrjerdy, H.W. van Zeijl, "A silicon avalanche photodiode for single optical photon counting in the Geiger mode", Sensor and Actuators A 60 (1997), pp. 98-102.

D. Renker, " Geinger-mode avalanche photodiodes, history, properties and problems", Nuclear Instruments and Methods in Physics Research A 567 (2006), pp. 48-56.

Emilio Sciacca, Andrea C. Giudice, Delfo Sanfilippo, Franco Zappa, Salvatore Lombardo, Rosario Consentino, Cinzia Di Franco, Massimo Ghioni, Giorgio Fallica, Giovanni Bonanno, Sergio Cova, and Emanuele Rimini, "Silicon Planar Technology for Single-Photon Optical Detectors", IEEE Transactions on Electron Devices, vol. 50, No. 4, Apr. 2003, pp. 918-925.

P. Buzhana, B. Dolgosheina, L. Filatovb, A. Ilyina, V. Kantzerova, V. Kaplina, A. Karakasha, F. Kayumovc, S. Kleminb, E. Popovaa, S. Smirnov, "Silicon photomultiplier and its possible applications", Nuclear Instruments and Methods in Physics Research A 504 (2003) 48-52.

Massimo Ghioni, Angelo Gulinatti, Ivan Rech, Franco Zappa, and Sergio Cova, "Progress in Silicon Single-Photon Avalanche Diodes", IEEE Journal of Selected Topics in Quantum Electronics, vol. 13, No. 4, Jul./Aug. 2007, pp. 852-862.

E. Sciacca, S. Lombardo, M. Mazzillo, G. Condorelli, D. Sanfilippo, A. Contissa, M. Belluso, F. Torrisi, S. Billotta, A. Campisi, L. Cosentino, A. Piazza, G. Fallica, P. Finocchiaro, F. Musumeci, S. Privitera, S. Tudisco, G. Bonanno, and E. Rimini, "Arrays of Geiger Mode Avalanche Photodiodes", IEEE Photonics Technology Letters, vol. 18, No. 15, Aug. 1, 2006, pp. 1633-1635.

J. C. Jackson, D. Phelan, A. P. Morrison, R. M. Redfern and A. Mathewson, "Towards integrated single photon counting microarrays", Optical Engineering, vol. 42, No. 1, Jan. 2003, pp. 112-118.

Cristiano Niclass, Alexis Rochas, Pierre-André Besse, and Edoardo Charbon, "Design and Characterization of a CMOS 3-D Image Sensor Based on Single Photon Avalanche Diodes", IEEE Journal of Solid-State Circuits, vol. 40, No. 9, Sep. 2005, pp. 1847-1854.

Franco Zappa, Angelo Gulinatti, Piera Maccagnani, Simone Tisa, and Sergio Cova, "SPADA: Single-Photon Avalanche Diode Arrays", IEEE Photonics Technology Letters, vol. 17, No. 3, Mar. 2005, pp. 657-659.

Brian F. Aull, Andrew H. Loomis, Douglas J. Young, Richard M. Heinrichs, Bradley J. Felton, Peter J. Daniels, and Deborah J. Landers, "Geiger-Mode Avalanche Photodiodes for Three-Dimensional Imaging", Lincoln Laboratory Journal, vol. 13, No. 2, 2002, pp. 335-350.

Dieter Renker, "Properties of avalanche photodiodes for applications in high energy physics, astrophysics and medical imaging", Nuclear Instruments and Methods in Physics Research A 486 (2002), pp. 164-169.

S. Vasile, P. Gothoskar, R. Farrell and D. Sdrulla, "Photon Detection with High Avalanche Photodiode Arrays", IEEE Transactions on Nuclear Science, vol. 45, No. 3, Jun. 1998, pp. 720-723.

U.S. Appl. No. 12/637,628, filed Dec. 14, 2009, "Geiger-Mode Photodiode With Integrated and Adjustable Quenching Resistor, Photodiode Array, and Manufacturing Method Thereof".

A. Campisia, L. Cosentino, P. Finocchiaro, A. Pappalardo, F. Musumeci, S. Privitera, A. Scordino, S. Tudisco, G. Fallica, D. Sanfilippo, M. Mazzillo, G. Condorelli, A. Piazza, G. Valvo, S. Lombardo, E. Sciacca, G. Bonanno, M. Belluso, "Multipixel geigermode photon detectors for ultra-weak light sources", Nuclear Instruments and Methods in Physics Research A 571 (2007), pp. 350-354.

Massimo Mazzillo, Alessandro Piazza, Giovanni Condorelli, Delfo Sanfilippo, Giorgio Fallica, Sergio Billotta, Massimiliano Belluso, Giovanni Bonanno, Luigi Cosentino, Alfio Pappalardo, and Paolo Finocchiaro, "Quantum Detection Efficiency in Geiger Mode Avalanche Photodiodes", IEEE Transactions on Nuclear Science, vol. 55, No. 6, Dec. 2008, pp. 3620-3625.

F. Zappa, S. Tisa , A. Tosi, S. Cova, "Principles and features of single-photon avalanche diode arrays", Sensors and Actuators A 140 (2007), pp. 103-112.

M. Mazzillo, G. Condorelli, A. Campisi, E. Sciacca, M. Belluso, S. Billotta, D. Sanfilippo, G. Fallica, L. Cosentino, P. Finocchiaro, F. Musumeci, S. Privitera, S. Tudisco, S. Lombardo, E. Rimini, G. Bonanno, "Single photon avalanche photodiodes arrays", Sensors and Actuators A 138 (2007), pp. 306-312.

K. Shimakura, T. Suzuki and Y. Yadoiwa, "Boron and Phosphorus Diffusion Through an SiO2 Layer From a Doped Polycrystalline Si Source Under Various Drive-In Ambients", Solid-State Electronics, 1975, vol. 18, pp. 991-997.

Search Report for Italian Application No. TO20100251, Ministero dello Sviluppo Economico, Nov. 12, 2010, pp. 3.

Italian Search Report for Application No. ITTO20090322, Ministero dello Sviluppo Economico, Nov. 6, 2009, pp. 2.

U.S. Appl. No. 13/070,876, filed Mar. 24, 2011, "Geiger-Mode Avalanche Photodiode With High Signal-To-Noise Ratio, and Corresponding Manufacturing Process".

* cited by examiner

ARRAY OF MUTUALLY ISOLATED, GEIGER-MODE, AVALANCHE PHOTODIODES AND MANUFACTURING METHOD THEREOF

PRIORITY CLAIM

The present application claims the benefit of Italian Patent Application Serial No.: TO2008A000046, filed Jan. 18, 2008, which application is incorporated herein by reference in its entirety.

RELATED APPLICATION DATA

This application is related to the U.S. patent application Ser. No. 12/356,464, entitled ARRAY OF MUTUALLY INSULATED GEIGER-MODE AVALANCHE PHOTODIODES, AND CORRESPONDING MANUFACTURING PROCESS filed Jan. 20, 2009, now U.S. Pat. No. 8,471,293, Issued Jun. 25, 2013 and which is incorporated herein in its entirety. The present application is also related to U.S. patent application Ser. No. 12/637,628, entitled GEIGER-MODE PHOTODIODE WITH INTEGRATED AND ADJUSTABLE QUENCHING RESISTOR, PHOTODIODE ARRAY, AND MANUFACTURING METHOD THEREOF filed Dec. 14, 2009; U.S. patent application Ser. No. 12/764,888, entitled GEIGER-MODE PHOTODIODE WITH INTEGRATED AND JFET-EFFECT-ADJUSTABLE QUENCHING RESISTOR, PHOTODIODE ARRAY, AND CORRESPONDING MANUFACTURING METHOD filed Apr. 21, 2010, now U.S. Pat. No.8,479,730, Issued Jul. 2, 2013; and U.S. patent application Ser. No. 13/070,876, entitled GEIGER-MODE AVALANCHE PHOTODIODE WITH HIGH SIGNAL-TO-NOISE RATIO, AND CORRESPONDING MANUFACTURING PROCESS filed Mar. 24, 2011.

TECHNICAL FIELD

An embodiment of the present disclosure relates to an array of mutually insulated Geiger-mode avalanche photodiodes, and to a corresponding method of manufacture.

BACKGROUND

As is known, in the technical field of photon detection, the counting and detection of individual photons is assuming an ever-increasing importance.

In molecular biology, for example, the detection of molecules is performed using fluorescence or luminescence phenomena, frequently characterized by extremely reduced light emission.

Extremely sensitive sensors are moreover required in the digital capture of three-dimensional images in reduced lighting conditions.

To this end, Geiger-mode avalanche photodiodes find a wide range of uses in so far as their high quantum efficiency allows detection of both individual photons and packets of photons.

A Geiger-mode avalanche photodiode operates at a higher reverse biasing voltage than the breakdown voltage.

The sensitivity to incident photons and, thus, the likelihood of detection depend upon the value of reverse biasing voltage of the photodiode. In particular, the greater the reverse biasing voltage, beyond the breakdown threshold, the greater the likelihood of an avalanche generation of charge carriers occurring.

In this condition and in the absence of incident photons, an individual charge carrier generated in conditions of darkness, for example by transfer of thermal energy, is sufficient to trigger the process of avalanche carrier generation by impact ionization, generating a flow of current referred to as "dark current".

The dark current is an undesirable effect in this type of devices in so far as it generates an electrical signal even in the absence of incident photons, and this may adversely interfere with the normal use of the device.

In addition, Geiger-mode avalanche photodiodes belonging to an array of photodiodes are extremely sensitive not only to the photons that impinge thereon, but also to charge carriers (for example, electrons) generated by the adjacent photodiodes sharing the same substrate and to photons generated by electroluminescence during the avalanche multiplication in adjacent photodiodes. These effects are known, respectively, as "electrical cross-talk" and "optical cross-talk".

In order to fully exploit the sensitivity of the Geiger photodiode for detection of individual photons and to reduce the negative effect of electrical and optical cross-talk, the active regions of these photodiodes are made such that the crystal lattice includes an extremely small number of defects. In this condition, a carrier generated in dark conditions statistically possesses a long mean free path before generating an avalanche effect through an impact-ionization mechanism.

In the time interval corresponding to the free path, which is relatively long, of a charge carrier, an incident photon can generate an electron-hole pair, which triggers the process of avalanche generation, determining a flow of current associated with the incident photon, which enables detection thereof.

Since the process of avalanche generation is self-sustaining, it is necessary to implement a circuit for quenching the avalanche effect and resetting the photodiode so as to render it available for detection of a further photon. Currently known quenching circuits are of two types: active ones and passive ones.

In the passive-quenching mode, a resistor having a high resistance is set in series with the photodiode. A photon impinging upon the photodiode causes an increase of current in the photodiode and in the series-connected resistor, causing a voltage drop that reduces the electrical field that sustains the avalanche carrier generation to a value lower than the breakdown voltage. Consequently, the avalanche carrier generation is interrupted.

In the active-quenching mode, a purposely designed external circuit detects the increase of current caused by an impinging photon and reduces the voltage on the photodiode below the breakdown threshold using a switch that connects the photodiode to a resistor having a high resistance and operating analogously to the described passive mode. In both the passive and the active modes, at the end of the photodiode-current resetting, the reverse voltage applied thereto again reaches a high value, higher than the breakdown voltage.

Currently known quenching resistors of the passive type are implemented by external resistive elements, generally of polysilicon, electrically series-connected to the photodiodes. This solution has, however, the disadvantage of increasing the area required by each photodiode, consequently reducing the possibility of high density integration of the devices on a same chip.

Getting back to the problem of optical and/or electrical cross-talk, some solutions have been proposed.

According to a first solution proposed for the reduction of optical cross-talk, each photodiode is insulated from adjacent photodiodes by metal trenches having the function of mirroring the photons responsible for optical cross-talk; this solution is typically ineffective as regards electrical cross-talk.

According to a second solution, aimed at eliminating both optical and electrical cross-talk, each photodiode is insulated from the adjacent photodiodes by V-shaped grooves. This approach, however, drastically reduces the possibility of high density integration of the components on account of the considerable area occupied by the V-shaped grooves.

According to a third solution, which is also suitable for eliminating both types of cross-talk, the individual photodiodes are provided in separate dies assembled mechanically within a same package. In this solution, the photodiodes do not share the same substrate as the adjacent photodiodes, and a total insulation is obtained both from the optical and the electrical standpoint. This latter solution also has the disadvantage of not enabling a high level of integration of the components and has high production costs.

SUMMARY

An embodiment of the present disclosure includes an array of avalanche photodiodes that enables a reduction of the optical and electrical cross-talk together with a high-density integration.

According to embodiments of the disclosure, there are provided an array of Geiger-mode avalanche photodiodes, a system that uses this array of photodiodes, and the corresponding manufacturing method.

BRIEF DESCRIPTION OF THE DRAWINGS

For a better understanding of the subject matter, embodiments thereof are now described, purely by way of non-limiting example and with reference to the attached drawings.

DETAILED DESCRIPTION

Figure 1:
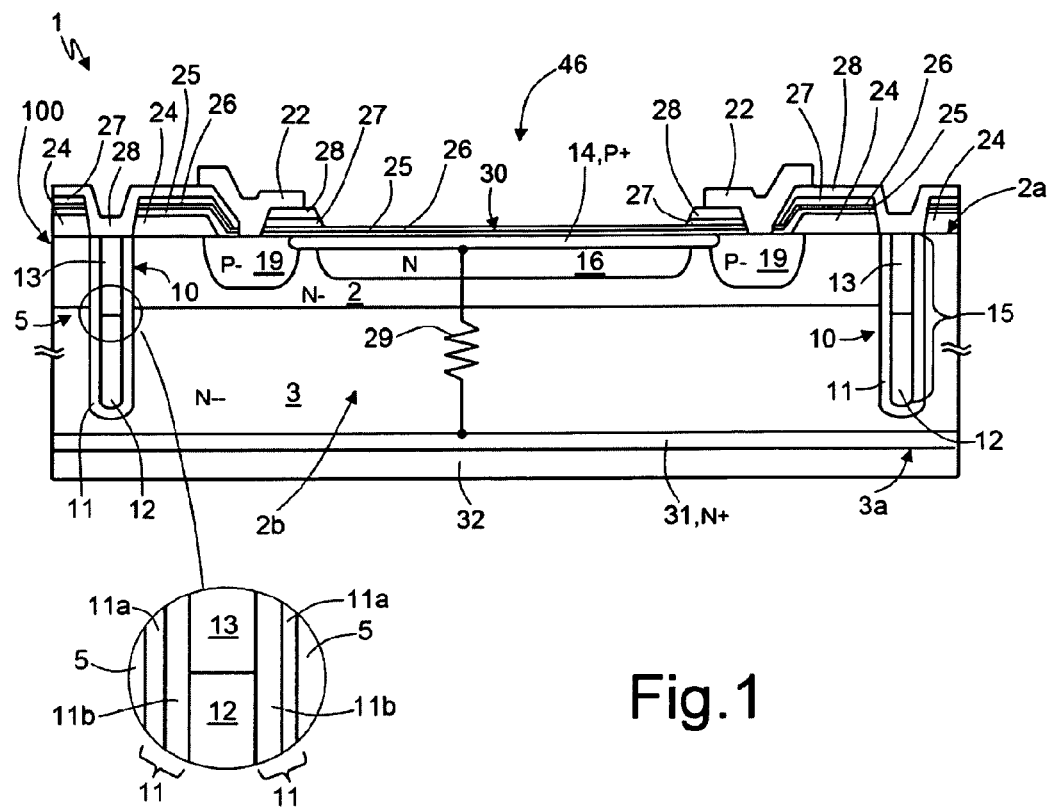
FIG. 1 is a cross-section of a first embodiment of a photodiode belonging to an array of photodiodes.
Figure 2:
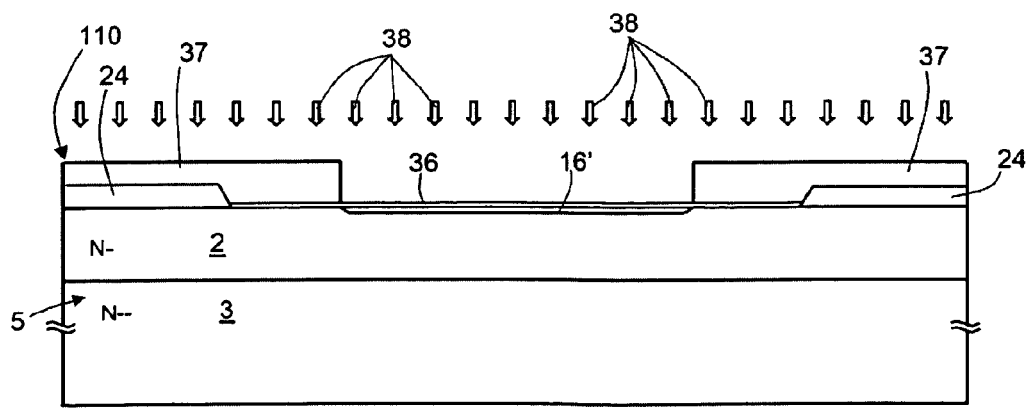
FIGS. 2-11 show cross-sections of a photodiode belonging to an array of photodiodes in successive manufacturing steps.
Figure 3:
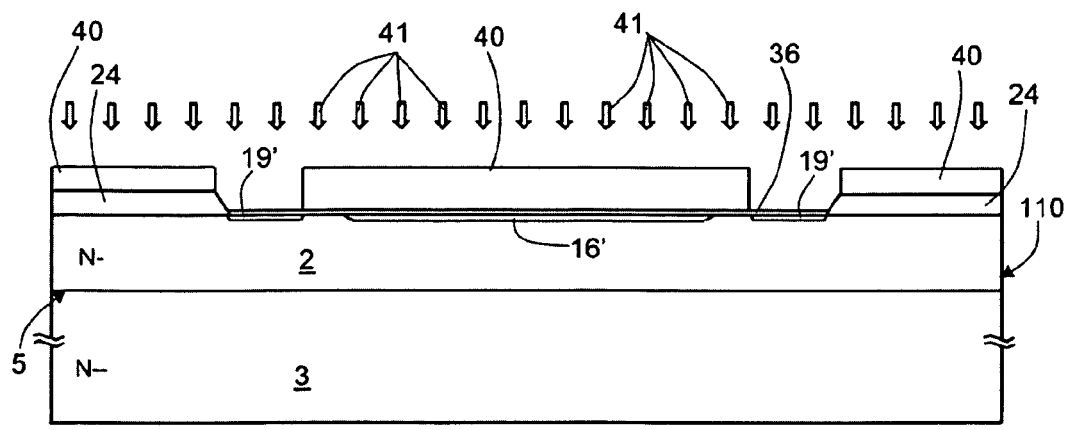
Figure 4:
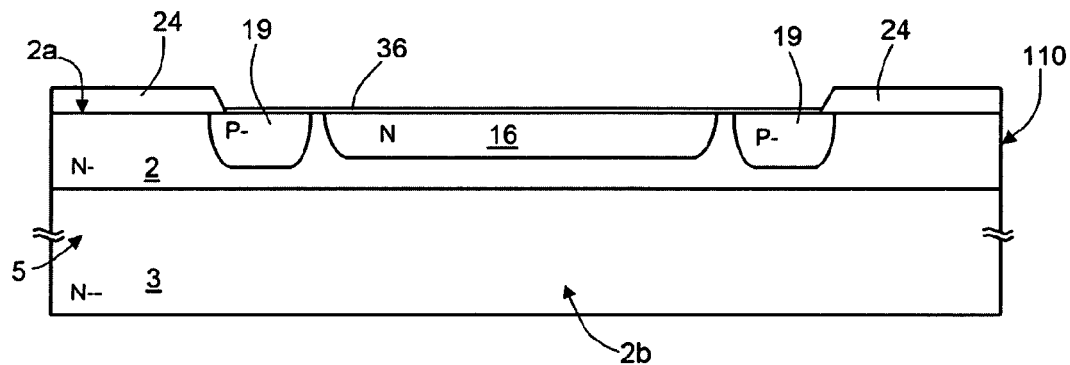
Figure 5:
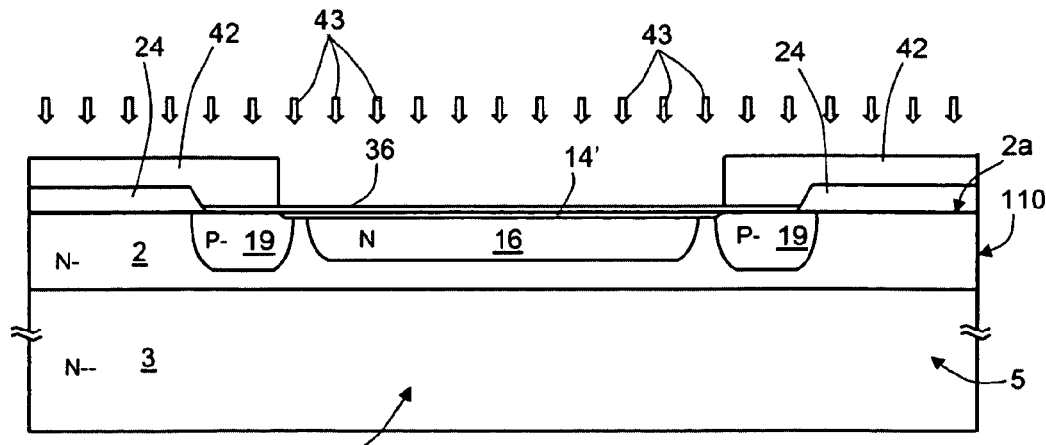
Figure 6:
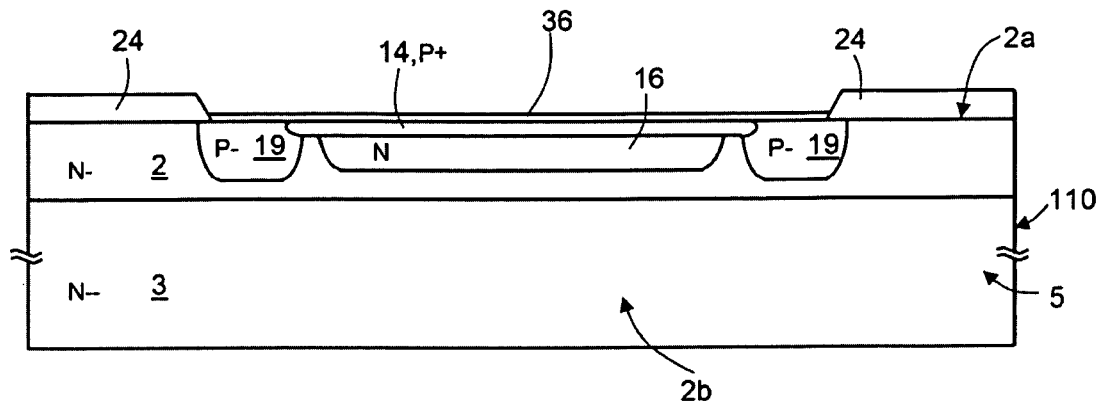
Figure 7:
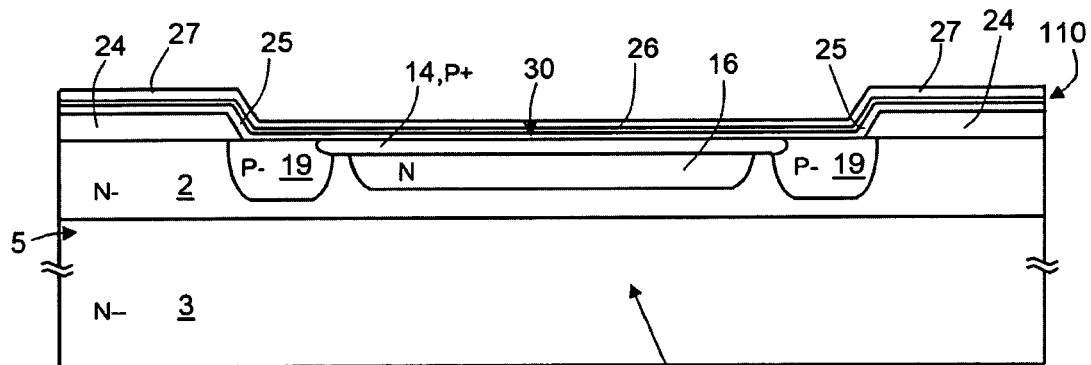
Figure 8:
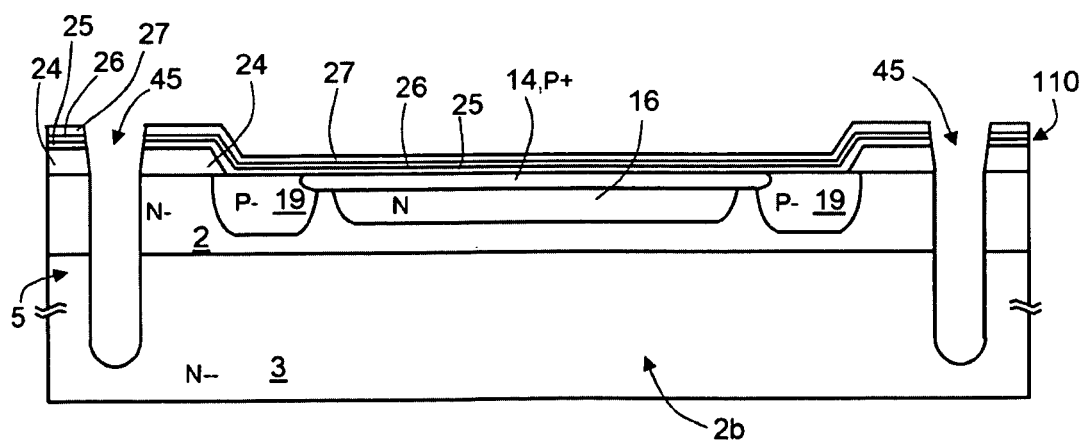
Figure 9:
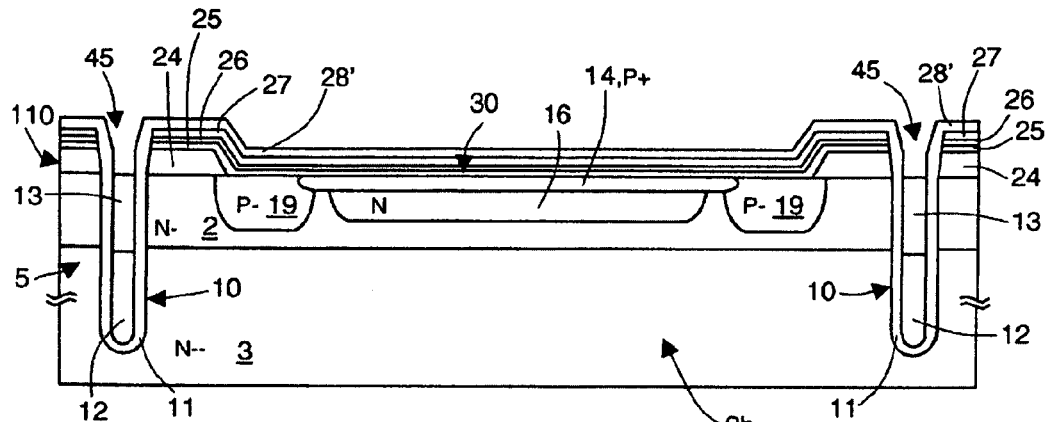
Figure 10:
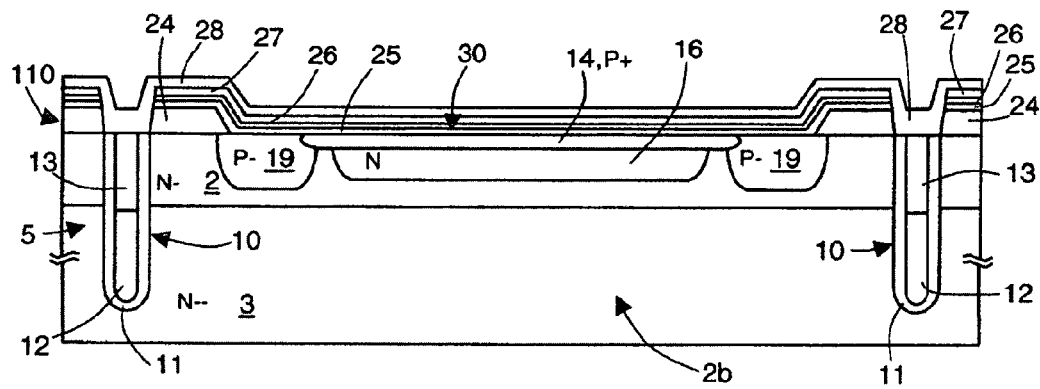

FIG. 1 shows an embodiment of a photodiode 1 of a Geiger type belonging to an array 220 (shown in FIG. 16) of photodiodes 1. The array 220 may comprise any number of photodiodes 1 according to the application.

The photodiode 1 is integrated in a chip 100 including an epitaxial layer 2 of an N− type having a top surface 2a and overlying, in direct contact, a substrate 3, of an N−− type, for example, of a float-zone type. The substrate 3 has a bottom surface 3a. The substrate 3 and the epitaxial layer 2 form in practice a body 5 of semiconductor material.

A substrate of a float-zone type may be characterized by a high purity level for reducing the presence of sites where avalanche carrier generation in dark conditions may occur.

A deep lateral insulation region 10 having, in top view, a circular or polygonal shape, extends vertically through the epitaxial layer 2 and part of the substrate 3 so as to delimit and insulate portions of the body 5, each forming an active area 2b housing a single photodiode 1.

In practice, each photodiode 1 is insulated from the adjacent photodiodes 1 by the lateral insulation region 10.

The lateral insulation region 10 comprises a channel-stopper region 11, of dielectric material, for example oxide, arranged more externally and in direct contact with the epitaxial layer 2 and the substrate 3; and a mirror region 15, filling and surrounded by the channel-stopper region 11. The mirror region 15 is here formed by a polysilicon region 12, for example, of an N type, extending in the bottom portion of the lateral insulation region 10, and by a metal region 13, for example of tungsten, extending within the channel-stopper region 11, on the polysilicon region 12.

In use, the channel-stopper region 11 has the function of improving the electrical insulation, inhibiting the passage of electrons between adjacent photodiodes, while the polysilicon region 12 and the metal region 13 have the function of inhibiting the passage of photons.

As shown clearly in the enlarged detail, in order to improve the insulation, the channel-stopper region 11 may be formed by a double layer: a thin outer coating layer 11a, for example of thermal oxide, arranged more externally, and a thick inner coating layer 11b, for example of TEOS oxide, arranged more internally.

In each active area 2b, an anode region 14, of a circular or quadrangular shape and of a P+ type, extends within the epitaxial layer 2, facing the top surface 2a.

An enriched region 16 of an N type extends in the epitaxial layer 2, underneath and in direct contact with the anode region 14.

A guard ring 19 of a circular shape and of a P− type extends into the epitaxial layer 2 facing the top surface 2a, on the outside of and contiguous with the anode region 14. The guard ring 19 forms a PN diode with the epitaxial layer 2 so as to prevent edge breakdown of the anode region 14. In addition, the guard ring 19 is in direct electrical contact with an anode metal region 22.

A first dielectric layer 24 extends on a peripheral region of the top surface 2a, laterally staggered with respect to the anode region 14.

A second dielectric layer 25, for example an oxide layer, extends above the top surface 2a, on top of the first dielectric layer 24, the anode region 14 and the guard ring 19. A nitride coating layer 26 extends above the second dielectric layer 25 and provides, together with the latter, an anti-reflection coating 30.

By appropriately modulating the thickness of the second dielectric layer 25 and of the coating layer 26, it is possible to optimize the anti-reflection coating 30 such that it is transparent only for a specific wavelength range and reflects the wavelengths falling outside this range.

It is thus possible to provide photodiodes 1 that are sensitive only to some wavelengths of the light spectrum. For example, if the second dielectric layer 25 has a thickness of 150 nm and the coating layer 26 has a thickness of 80 nm, an anti-reflection coating 30 is obtained, which is transparent for wavelengths comprised in the approximately range of 400-450 nm and opaque for wavelengths falling outside this range.

A third and a fourth dielectric layer 27, 28 extend above the coating layer 26, laterally staggered with respect to the anode region 14. However, on top of the lateral insulation region 10, the fourth dielectric layer 28 is in direct contact with the top surface 2a and traverses the dielectric layers 24-27, as explained in more detail hereinafter.

A cathode-contact region 31 of an N+ type extends within the substrate 3, and faces the bottom surface 3a. The cathode-contact region 31 is moreover in direct contact with a cathode metal region 32 of metal material, which extends on the bottom surface 3a of the substrate 3.

The enriched region 16, of an N type, the epitaxial layer 2, of an N− type, the substrate 3, of an N−− type, and the cathode-contact region 31 form a cathode region (2, 3, 16, 31), which comprises a resistive region (2, 3, 16) formed by the epitaxial layer 2, the substrate 3, and the enriched region 16. The resistive region (2, 3, 16) provides an integrated quenching resistor 29, electrically coupled in series between the anode region 14 and the cathode-contact region 31. To this end, the doping levels of the epitaxial layer 2 and of the substrate 3 may be set so as to obtain a resistivity suitable for quenching the photodiode current. For example, they can have a resistivity of 100 Ω·cm, corresponding, for an epitaxial layer 2 and a substrate 3 with, respectively, a thickness of 5 μm and 50-100 μm, to a resistance of 500 kΩ.

The array of photodiodes 1 of FIG. 1 may thus be obtained with a high level of integration thanks to the high insulation provided by the lateral insulation region 10 and by the integration of the quenching resistors 29 within the body 5. In particular, the presence of the channel-stopper region 11 is particularly effective for inhibiting the passage of charged particles, and the mirror region 15 is effective for inhibiting the passage of photons within the body 5.

Although the lateral insulation region 10 does not extend throughout the entire extension of the substrate 3, it may be deemed that the likelihood of electrons and/or photons reaching the active area 2b of adjacent photodiodes 1, thus giving rise to a dark current, is, in the proximity of the bottom surface 3a, very low.

The photodiodes 1 of FIG. 1 may be manufactured using the method described hereinafter and represented in FIGS. 2-10.

Initially (FIG. 2), an epitaxial layer 2 with an N− type doping is grown on a float-zone substrate 3, of an N− type, to obtain a wafer 110. For example, the substrate 3 may have a thickness of 500 μm, and the epitaxial layer 2 may have a thickness of 100 μm. Then the first dielectric layer 24, for example, an oxide layer of a thickness preferably of 300 nm, is first grown by thermal oxidation above the epitaxial layer 2 and then selectively removed by chemical wet etching where the anode region 14 is to be provided. Wet etching may be better than dry etching since it prevents any possible damage to the crystal lattice of the epitaxial layer 2 and enables a reduction of undesirable contaminating particles being introduced into the epitaxial layer 2.

In order to prevent, during the doping process, metal impurities from contaminating the epitaxial layer 2, a first protective layer 36, for example an oxide layer with a thickness of 50 nm, is grown on the epitaxial layer 2.

Then, in order to reduce the contamination of sites outside the region in which the implantation is to be made, a first resist mask 37 is formed on the wafer 110 so as to define the area where the enriched region 16 is to be obtained.

A low-energy implantation of dopant species of an N type (represented by the arrows 38) is then performed in the epitaxial layer 2 so as to localize the dopant species in a first thin layer 16' (FIG. 2) set underneath the protective layer 36 and designed to form the enriched region 16 after appropriate thermal annealing (as explained hereinafter) has been carried out.

Then (FIG. 3), the first resist mask 37 is removed, and a second resist mask 40 is formed on the wafer 110 so as to define the region where the guard ring 19 is to be formed. A low-energy implantation of dopant species of a P type (represented by the arrows 41) is then performed in the epitaxial layer 2 so as to localize the dopant species in a second thin layer 19' extending underneath the protective layer 36, at a distance from the first thin layer 16'.

Next (FIG. 4), the second resist mask 40 is removed, and a thermal annealing is performed, for example at the temperature of 1150° C. for two hours so as to reduce the sites of the epitaxial layer 2 that have been damaged following upon ion implantation and activation of the dopant species, thus forming the enriched region 16 of an N type, facing the top surface 2a, and the guard ring 19 of a P− type, also facing the top surface 2a. This operation, for example, enables a breakdown voltage of the photodiode junction of approximately 25 V to be obtained.

Then (FIG. 5), a third resist mask 42 is formed on the wafer 110 so as to define the region where the anode region 14 is to be provided, and next a low-energy implantation of dopant species of a P type (represented by the arrows 43), for example of boron atoms, is performed in the epitaxial layer 2 so as to localize the dopant species in a third thin layer 14' underneath the protective layer 36.

Next (FIG. 6), the third resist mask 42 is removed and a thermal annealing is performed, for example at the temperature of 850° C. for an hour so as to reduce the sites of the epitaxial layer 2 that have been damaged following the ion implantation and activation of the dopant species, in this way forming the anode region 14, of a P+ type, facing the top surface 2a, internal to and in direct contact with the guard ring 19, and extending on top of and in electrical contact with the enriched region 16.

Then (FIG. 7), the second dielectric layer 25, for example an oxide layer, is deposited, e.g., by chemical-vapor deposition (CVD), on the surface of the wafer 110, and then the coating layer 26, for example a nitride layer, is deposited above the second dielectric layer 25 to form the anti-reflection coating 30.

Finally, the third dielectric layer 27, for example of TEOS oxide, is deposited by CVD on the surface of the wafer 110, on top of the anti-reflection coating 30; the third dielectric layer 27 having the function of protecting the underlying layers in subsequent fabrication steps.

Next (FIG. 8), the lateral insulation region 10 is formed. To this end, a dry etch is carried out so as to form a trench 45 having, in top plan view, for example, a circular, quadrangular, or, in general, polygonal shape, of a width of 2-3 μm and a depth of approximately between 50 and 100 μm, such as of approximately 100 μm.

Then (FIG. 9), the thin coating layer 11a is first grown on the wafer 110, on the internal edges and on the bottom of the trench 45 (as is shown in the enlarged detail of FIG. 1); the thin coating layer 11a having a thickness of approximately between 50 and 100 nm, for example, approximately 50 nm; then, the thick coating layer 11b, for example of TEOS oxide is formed, for example by CVD, having a thickness comprised approximately between 100 and 300 nm, such as approximately 200 nm. As explained hereinafter, the layers 11a, 11b are designed to form, on top of the surface 2a and together with further layers, the fourth dielectric layer 28 and are identified in FIG. 9 by 28'.

The trench 45 is then filled by depositing polysilicon and then metal to form the polysilicon region 12 and the metal region 13. In particular, after the polysilicon deposition and before the metal deposition, a KOH (potassium hydroxide) etch is carried out in order to remove the excess part of the polysilicon layer. After the metal deposition, an etch is made, for example a dry etch, to remove the portion of the metal layer on top of the surface 2a.

Next (FIG. 10), a further dielectric layer, for example of TEOS oxide having a thickness of approximately 300 nm, is deposited on the surface of the wafer 110 so as to insulate the metal region 13 from the external environment. The further dielectric layer is deposited on top of the thin coating layer 11a and the thick coating layer 11b to form the fourth dielectric layer 28.

Next (FIG. 1), the third dielectric layer 27 and the fourth dielectric layer 28 are selectively removed so as to form a window 46, on top of the enriched region 16 and the anode region 14 so as to expose the anti-reflection coating region 30, which, in use, enables passage of photons that impinge upon the photodiode 1 towards the active area 2b. In order to provide the openings for the anode metal region 22, the second, third, and fourth dielectric layers 25, 27, 28 and the coating layer 26 are locally removed, by a chemical wet etching, at the sides of the anode region 14, at the guard region 19.

Finally, back-wafer grinding is carried out, so that the final thickness of the wafer 110 is approximately between 150 μm and 200 μm, for example, 150 μm, followed an implantation of dopant species of an N type, for example phosphorus, on the bottom surface 3a, and by a thermal annealing, for example at 600° C., in order to provide the cathode-contact region 31. Then the deposition, for example by sputtering, of metal material, for example aluminium, provides the cathode metal region 32.

It is moreover possible to carry out a low-temperature sintering in a hydrogen atmosphere in order to passivate any possible dangling bonds at the interface between the oxide regions and the silicon regions. The structure of FIG. 1 is thus obtained.

Figure 11:
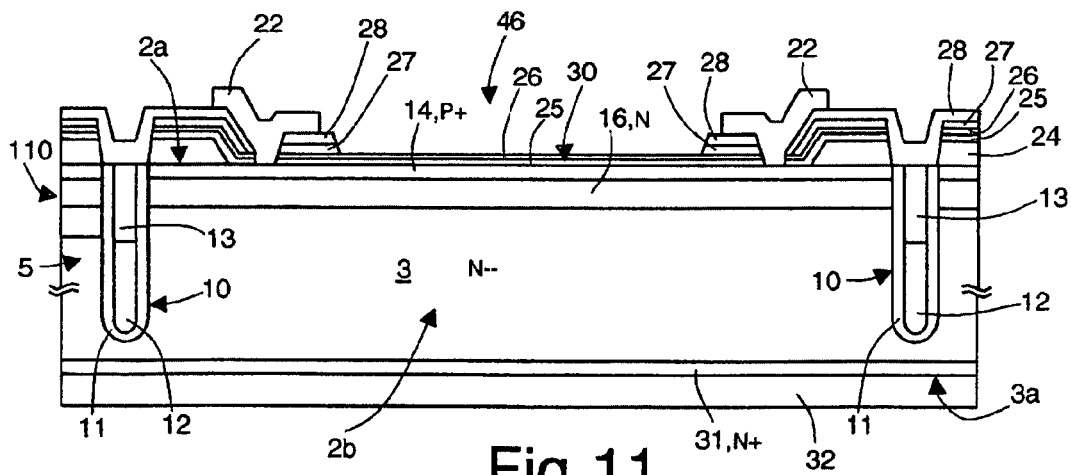
Figure 12:
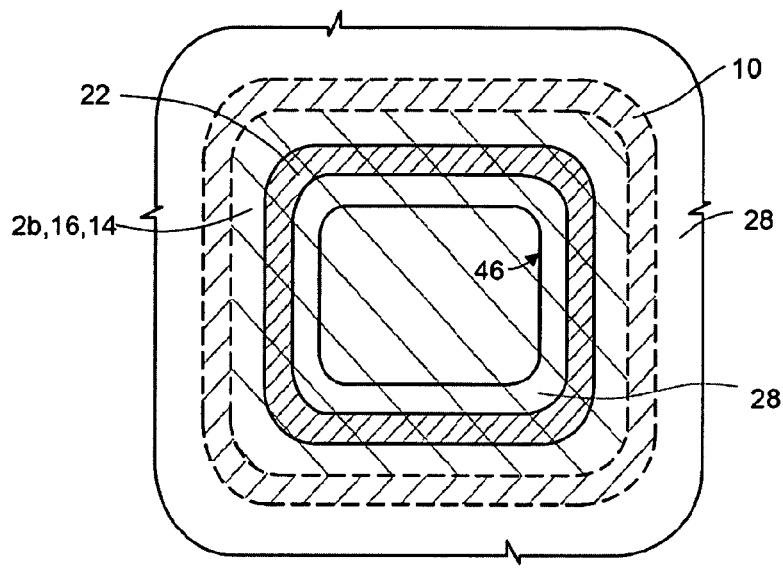
FIG. 12 is a top plan view of a photodiode belonging to an array of photodiodes.

FIGS. 11 and 12 show a different embodiment where the body 5 is formed exclusively by the substrate 3, and the guard ring 19 is not present. In addition, the anode region 14 and the enriched region 16 extend within the substrate 3 so as to span, in top view, the entire extension of the active area 2b (FIG. 12) and are in direct contact with the channel-stopper region 11 of the lateral insulation region 10.

In addition, the anode region 14 faces a surface of the substrate 3 once again referred to as "top surface" 2a (FIG. 11).

Figure 13:
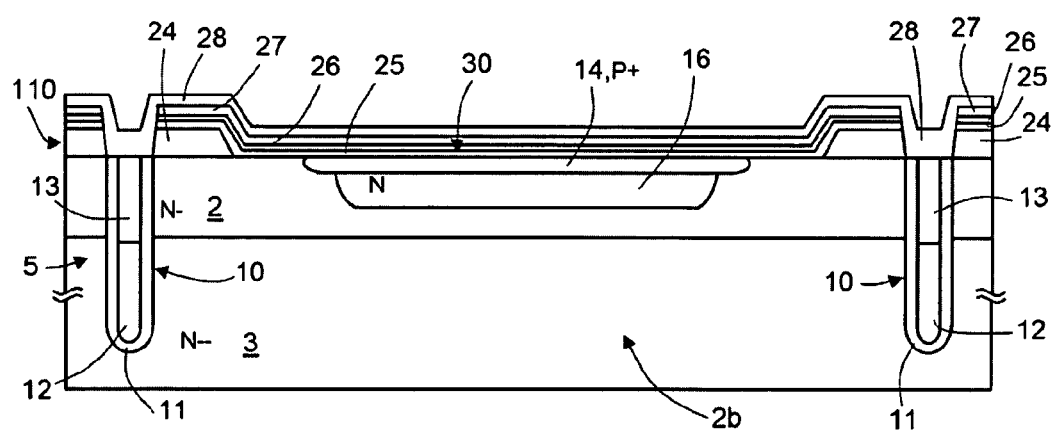
FIGS. 13-14 show cross-sections of variants of a photodiode belonging to an array of photodiodes.

FIG. 13 shows an embodiment where the guard ring 19 is not present, but the anode region 14 and the enriched region 16 do not occupy the entire extent of the active area 2b. This embodiment may be advantageous when there are no breakdown problems and the area of the photodiodes 1 is to be minimized.

Figure 14:
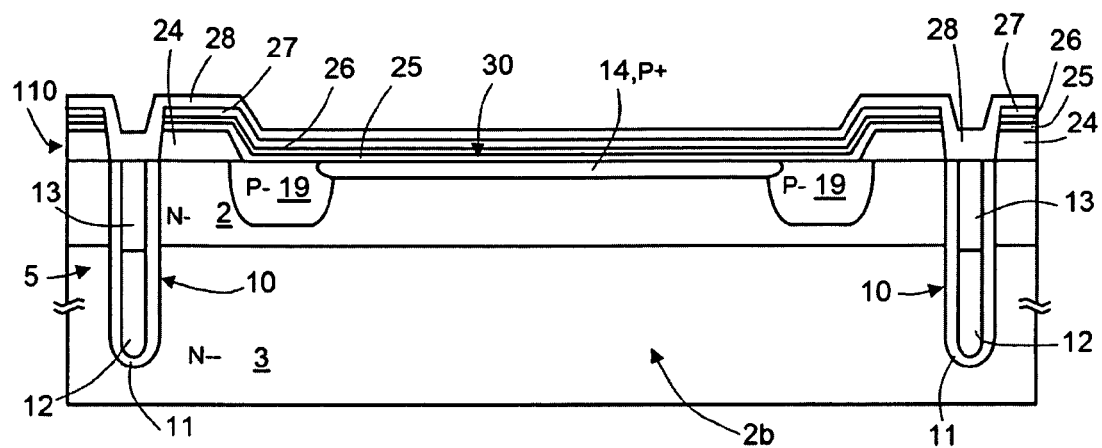

In FIG. 14, the enriched region 16 is, instead, absent. This embodiment may be advantageous for obtaining low-noise devices.

Figure 15:
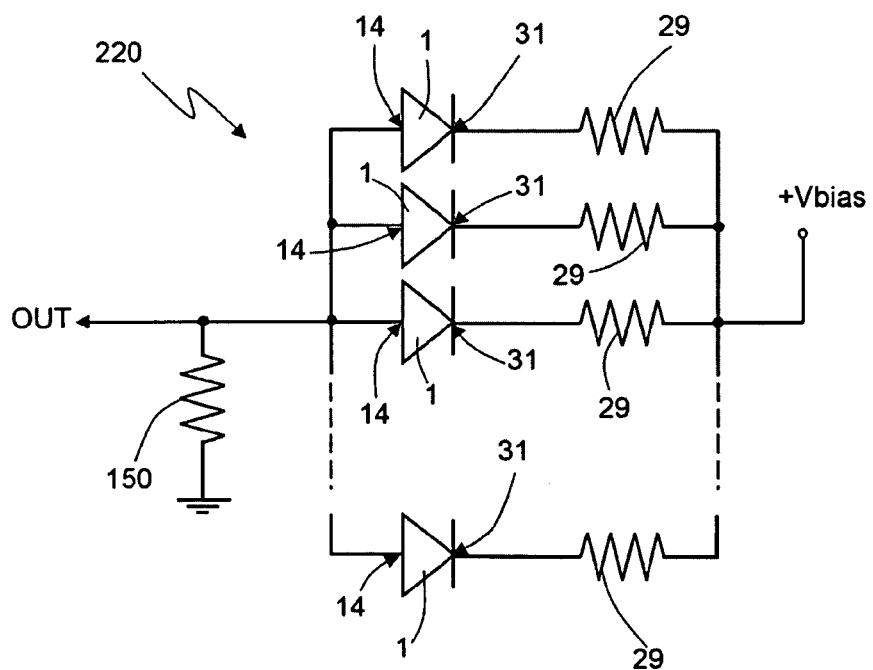
FIG. 15 shows an equivalent electrical representation of the array of FIG. 1.

FIG. 15 is an equivalent electrical representation of an array 220 of photodiodes 1 arranged in parallel to each other in order to increase the sensitivity. As may be noted, an optional quenching resistor 29 is series-connected to each photodiode 1, coupled to the cathode contact 31 of the photodiode 1. The cathode terminal 31 of each photodiode 1 is biased at a positive voltage $V_{bias}$, for example of 30 V, while the anode 14 of each photodiode 1 is grounded through a branch comprising a resistor 150, for example, of 50Ω. The resistors 29 may be in addition to the quenching resistors formed by the regions 2, 3, and 6 (FIG. 1), may substitute for these internal resistors, or may be in addition to these internal resistors.

Figure 16:
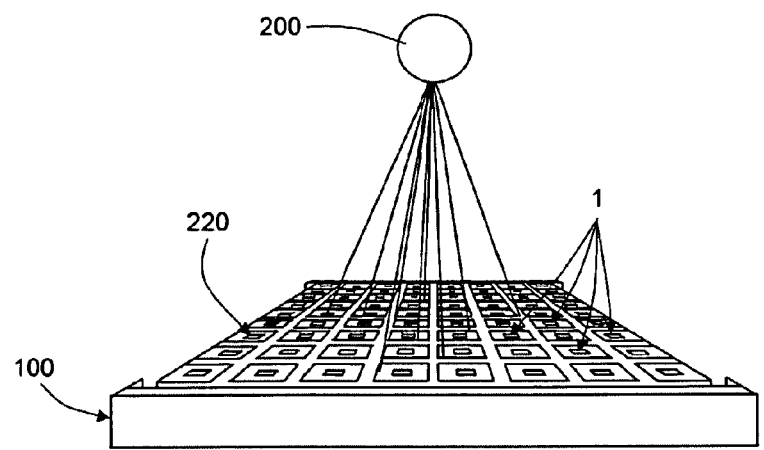
FIG. 16 is a schematic illustration of the array of FIG. 1 during use.

FIG. 16 shows an array 220 of photodiodes 1 in use, wherein a light source 200 illuminates a chip 100 on which the array 220 is integrated. In the embodiments shown, the photodiodes 1 form a matrix and are arranged in rows and columns.

Figure 17:
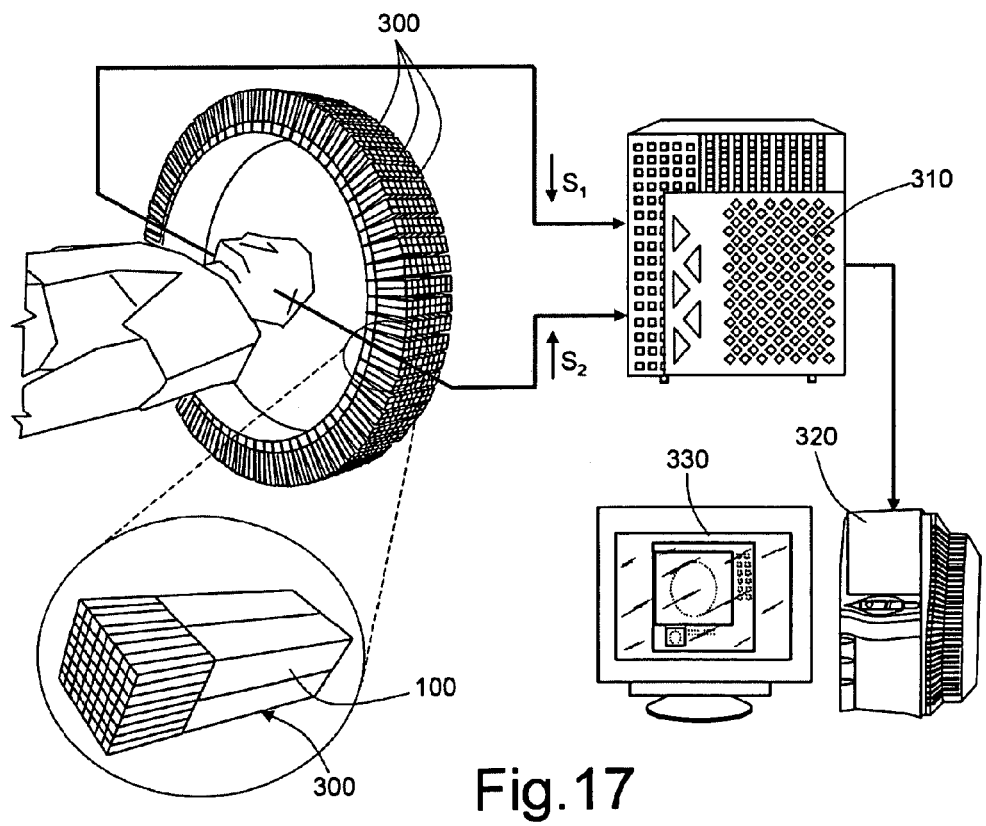
FIG. 17 shows an application of the array of FIG. 1.

An example of application of the array 220 of photodiodes 1 for obtaining images in the medical sector is shown in FIG. 17, together with an enlarged detail of a detector block 300.

Each detector block 300 is formed by an array 220 of photodiodes 1. Here each photodiode 1 operates, independently of the other photodiodes 1, as a detector of individual photons or packets of photons, generating an analog signal that is added to the signal generated by the other photodiodes 1 parallel-connected to produce an output signal $S_1$, $S_2$. In this way, each detector block 300 operates as a single photodetector with high quantum efficiency. The signals $S_1$, $S_2$ are then supplied to a coincidence processing unit 310, which yields the results of the processing operation through a processor 320, which enables display of the images detected on a display 330.

Figure 18:
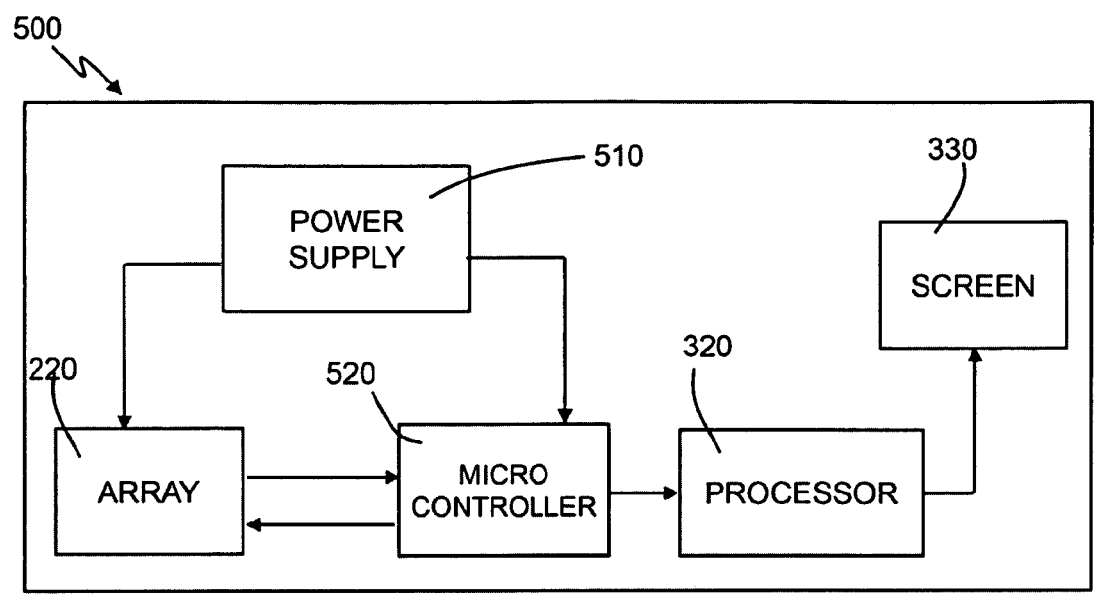
FIG. 18 shows a system that uses the array of FIG. 1.

Finally, the array 220 of photodiodes 1 may be used in a generic system 500 shown in FIG. 18, wherein a power supply 510 supplies at least one array 220 of photodiodes 1 and at least one microcontroller 520 coupled to the array 220. The microcontroller 520 processes and supplies the detected lighting information to a processor 320, which enables display of the images detected on a display 330. In this way, it is possible to provide, for example, a positron-emission tomography system.

Finally, it is evident that modifications and variations may be made to the array of photodiodes described herein, without thereby departing from the scope of the present disclosure.

For example, the substrate 3 and the body 2 may be of a inverse conductivity types, from those disclosed and the position of the cathode-contact region 31 and the anode region 14, as well as that of the respective electrodes, may be reversed. In addition, the insulation region 10 may also be formed before formation or in an intermediate step during formation of the regions 16, 19, 14 in the epitaxial layer 2.

The array 220 of photodiodes 1 may also be used in the field of the molecular biology, as a light sensor in fluorescence microscopes used for detection of fluorescence or luminescence phenomena of extremely low intensity.

Arrays 220 of photodiodes 1 may also be used to provide sensors for photographic cameras and/or camcorders, in particular for capturing three-dimensional digital images in conditions of poor lighting.

Naturally, in order to satisfy local and specific requirements, a person skilled in the art may apply to the solution described above many modifications and alterations. Particularly, although the present disclosure has been described with a certain degree of particularity with reference to described embodiment(s) thereof, it should be understood that various omissions, substitutions and changes in the form and details as well as other embodiments are possible. Moreover, it is expressly intended that specific elements and/or method steps described in connection with any disclosed embodiment of the disclosure may be incorporated in any other embodiment as a general matter of design choice.

The invention claimed is:

1. A method for manufacturing an array of photodiodes, comprising:
   forming a body of semiconductor material having a first conductivity type, a top surface, and a bottom surface;
   forming, inside said body and facing said top surface, an anode region of the second conductivity type;
   forming, inside said body, a cathode region having the first conductivity type and a higher doping level than said body; and forming, inside said body, an insulation region extending through said body and surrounding the anode region, such that forming the insulation region includes forming a mirror region having a first mirror region of metal material and having a second mirror region of silicon material;

wherein the forming said cathode region comprises:
forming a cathode-contact region, facing said bottom surface; and
forming a resistive region defining a vertical quenching resistor, extending between said anode region and said cathode-contact region.

2. The method according to claim 1, wherein the step of forming said insulation region comprises forming a trench extending within the body; forming a channel-stopper layer of dielectric material inside said trench; filling a bottom portion of said trench with polycrystalline silicon so as to form said second mirror region; and filling a top portion of said trench with metal material so as to form said first mirror region.

3. The method according to claim 1, wherein forming a channel-stopper layer comprises growing a thin oxide coating inside said trench and depositing a thick oxide coating layer inside said trench on top of and in direct contact with said thin coating layer.

4. A method for manufacturing an array of photodiodes, comprising:
forming a body of semiconductor material having a first conductivity type, a top surface, and a bottom surface;
forming, inside said body and facing said top surface, an anode region of the second conductivity type;
forming, inside said body, a cathode region having the first conductivity type and a higher doping level than said body; and
forming, inside said body, an insulation region extending through said body and surrounding the anode region, such that forming the insulation region includes forming a mirror region of metal material;
wherein the forming said cathode region comprises:
forming a cathode-contact region, facing said bottom surface; and
forming a resistive region defining a vertical quenching resistor, extending between said anode region and said cathode-contact region; and
wherein the step of forming said resistive region comprises forming a substrate having the first conductivity type and a lower doping level than said cathode-contact region; and forming, above said substrate, an epitaxial layer having the first conductivity type and a doping level intermediate between a doping level of said cathode-contact region and a doping level of said substrate.

5. The method according to claim 4, comprising introducing dopant species having the first conductivity type inside said epitaxial layer underneath the anode region so as to form an enrichment region in direct contact with the anode region, said enrichment region having the first conductivity type and a higher doping level than said epitaxial layer.

6. The method according to claim 1, wherein forming said resistive region comprises forming a substrate having the first conductivity type and a doping lower level than the cathode-contact region, above said cathode-contact region.

7. The method according to claim 6, comprising introducing dopant species having the first conductivity type inside said substrate underneath the anode region so as to form an enrichment region, underneath and in direct contact with the anode region, said enrichment region having the first conductivity type and a higher doping level than said substrate.

8. The method according to claim 4, comprising introducing dopant species of the second conductivity type inside said epitaxial layer so as to form a guard region facing said surface, laterally and in direct contact with said anode region, said guard region having a lower doping level than said anode region.

9. The method according to claim 1, comprising the step of forming an anti-reflection coating region on top of said top surface.

10. The method according to claim 9, wherein forming said anti-reflection coating region comprises forming an oxide bottom coating layer on top of said top surface and forming a nitride coating layer on top of said bottom coating layer.

11. The method according to claim 1, wherein forming a body comprises providing a wafer of semiconductor material and, before forming said cathode-contact region, grinding said wafer and reducing the thickness of the wafer to obtain said bottom surface.

12. The method according to claim 1, comprising forming a cathode metal region extending underneath and in direct electrical contact with said bottom surface.

13. A method, comprising:
forming an anode in a semiconductor material;
forming in the semiconductor material a cathode contiguous with the anode;
forming a cathode contact over the semiconductor material;
forming in the semiconductor material a resistive region between and contiguous with the anode and the cathode contact; and
forming in the semiconductor material an insulating region having a first metallic portion around the anode and the cathode and a second non-metallic portion around the anode and the cathode disposed over the first metallic portion, the insulating region separated from the cathode contact.

14. The method of claim 13 wherein:
forming the anode comprises forming the anode in an epitaxial layer of the semiconductor material;
forming the cathode comprises forming the cathode in the epitaxial layer;
forming the resistive region comprises forming the resistive region in a substrate of the semiconductor material;
forming the cathode contact comprises forming a portion of the cathode contact over the substrate; and
forming the insulating region comprises forming the insulating region in the epitaxial layer and in the substrate.

15. The method of claim 13 wherein:
forming the anode comprises forming the anode in an epitaxial layer of the semiconductor material;
forming the cathode comprises forming the cathode in the epitaxial layer;
forming the resistive region comprises forming the resistive region in a substrate of the semiconductor material;
forming the cathode contact comprises forming a portion of the cathode contact in the substrate; and
forming the insulating region comprises forming the insulating region in the epitaxial layer and in the substrate.

16. The method of claim 13, further comprising:
doping the anode with a first dopant concentration; and
doping the cathode with a second doping concentration that is less than the first concentration.

17. The method of claim 13, further comprising doping the resistive region to have a same conductivity type as the cathode.

18. The method of claim 13, further comprising forming in the semiconductor layer a guard region around and contiguous with the anode and having a same conductivity as the anode.

19. The method of claim 13, further comprising forming an anti-reflective coating over the anode.

20. The method of claim 13 wherein forming the insulating region comprises forming the insulating region around at least a portion of the resistive region.

21. The method of claim 13 wherein forming the insulating region comprises:
  forming in the semiconductor material a trench around the anode and the cathode;
  lining the trench with an insulator; and
  forming a reflective material in the lined trench.

22. A method, comprising:
  forming an anode in a semiconductor material;
  forming in the semiconductor material a cathode contiguous with the anode;
  forming a cathode contact over the semiconductor material;
  forming in the semiconductor material a resistive region between and contiguous with the anode and the cathode contact; and
  forming in the semiconductor material an insulating region having a first metallic section and a second non-metallic section, the insulating region contiguous with the cathode extending into the cathode without traversing the semiconductor material and configured to prevent the passage of photons.

* * * * *